United States Patent
Montalbo et al.

(10) Patent No.: US 8,531,226 B2
(45) Date of Patent: Sep. 10, 2013

(54) BRIDGE CIRCUIT PROVIDING A POLARITY INSENSITIVE POWER CONNECTION

(75) Inventors: Joseph D. Montalbo, Menlo Park, CA (US); Steven Sapp, Felton, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/270,726

(22) Filed: Oct. 11, 2011

(65) Prior Publication Data

US 2012/0242390 A1    Sep. 27, 2012

Related U.S. Application Data

(60) Provisional application No. 61/466,217, filed on Mar. 22, 2011.

(51) Int. Cl.
| | |
|---|---|
| H03K 5/08 | (2006.01) |
| H03L 5/00 | (2006.01) |
| H01L 21/02 | (2006.01) |
| H01L 29/66 | (2006.01) |
| H01L 21/70 | (2006.01) |

(52) U.S. Cl.
USPC ........... 327/324; 361/246; 257/369; 257/242; 257/263

(58) Field of Classification Search
USPC .......................................... 327/324; 361/246
See application file for complete search history.

(56) References Cited

U.S. PATENT DOCUMENTS

| | | | |
|---|---|---|---|
| 3,434,034 A | 3/1969 | Garber et al. | |
| 5,268,833 A | 12/1993 | Axer | |
| 7,561,404 B2 * | 7/2009 | Sells | 361/246 |
| 2009/0294936 A1 | 12/2009 | Liu et al. | |

FOREIGN PATENT DOCUMENTS

| | | |
|---|---|---|
| DE | 2931465 A1 | 2/1981 |
| DE | 3400973 A1 | 7/1985 |

OTHER PUBLICATIONS

Zetex, ZVP4525E6, Mar. 2001, Zetex, Issue 1.*
Zetex, ZVN4525E6, Mar. 2001, Zetex, Issue 1.*
"Rectifier Bridge Has No 2Vf drop!", Theta Engineering Incorporated Electronics and Software Engineering Services, Retreived on Sep. 6, 2011, Document available at:http://web.archive.org/web/20040429083554/http://www.thetaeng.com/FETBridge.htm. Apr. 29, 2004.

* cited by examiner

*Primary Examiner* — Long Nguyen
*Assistant Examiner* — Thomas Skibinski
(74) *Attorney, Agent, or Firm* — Brake Hughes Bellermann LLP

(57) ABSTRACT

In one general aspect, an apparatus can include a polarity insensitive input coupled to a gate of a metal-oxide-semiconductor field effect transistor (MOSFET) device. The MOSFET device can have a gate dielectric rating greater than twenty-five volts. The apparatus can also include a fixed polarity output coupled to a source of the MOSFET device.

20 Claims, 9 Drawing Sheets

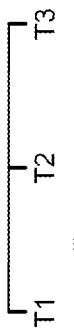
FIG. 3A — Polarity Insensitive Input C1
FIG. 3B — Polarity Insensitive Input C2
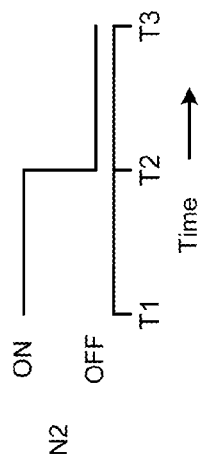
FIG. 3C — N1
FIG. 3D — N2
FIG. 3E — P1
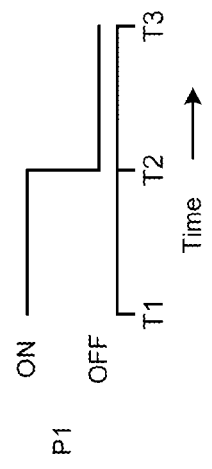
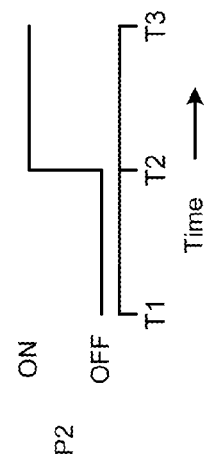
FIG. 3F — P2
FIG. 3G — Positive Output
FIG. 3H — Negative Output
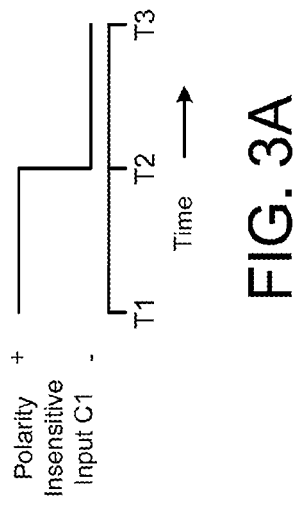
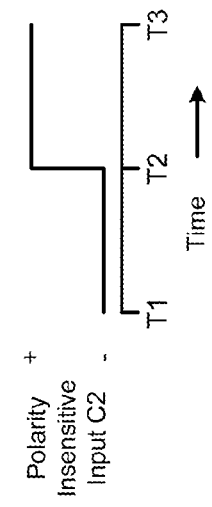

BRIDGE CIRCUIT PROVIDING A POLARITY INSENSITIVE POWER CONNECTION

RELATED APPLICATION

This application claims priority to and the benefit of U.S. Provisional Patent Application Ser. No. 61/466,217, filed on Mar. 22, 2011, entitled, "Bridge Circuit Providing a Polarity Insensitive Power Connection," which is incorporated herein by reference in its entirety.

TECHNICAL FIELD

This description relates to a bridge circuit for providing a polarity insensitive power connection.

BACKGROUND

Bridge rectifier circuits can be used at an input of a device (e.g., a Power over Ethernet (PoE) device) so that the input will be insensitive to the polarity of a power source coupled to the device. The device itself may be sensitive to the polarity of the power source, but the bridge rectifier can be configured to provide the proper polarity to the device when the polarity of the power source is reversed. Without the bridge rectifier circuit at the input, the device could be damaged when the polarity of the power source is improperly coupled to the device with a reversed polarity. Some systems, such as PoE systems, have specifications that require the systems to operate properly in spite of reversal in the polarity of applied power.

Many known bridge rectifier circuits can be configured using typical diodes (e.g., PN junction diodes, Shottky diodes). These known bridge rectifier circuits often have relatively high energy losses that are undesirable in many applications. Recently, metal-oxide-semiconductor field effect transistor (MOSFET) devices have been used in bridge rectifier circuits, but many additional external components in known solutions are often required to control these circuits and/or protect the gates of the MOSFET devices. Thus, a need exists for systems, methods, and apparatus to address the shortfalls of present technology and to provide other new and innovative features.

SUMMARY

In one general aspect, an apparatus can include a polarity insensitive input coupled to a gate of a metal-oxide-semiconductor field effect transistor (MOSFET) device. The MOSFET device can have a gate dielectric rating greater than twenty-five volts. The apparatus can also include a fixed polarity output coupled to a source of the MOSFET device.

The details of one or more implementations are set forth in the accompanying drawings and the description below. Other features will be apparent from the description and drawings, and from the claims.

BRIEF DESCRIPTION OF THE DRAWINGS

FIGS. 3A through 3H are graphs that collectively illustrate operation of the polarity switching circuit shown in FIG. 2.

DETAILED DESCRIPTION

Figure 1:
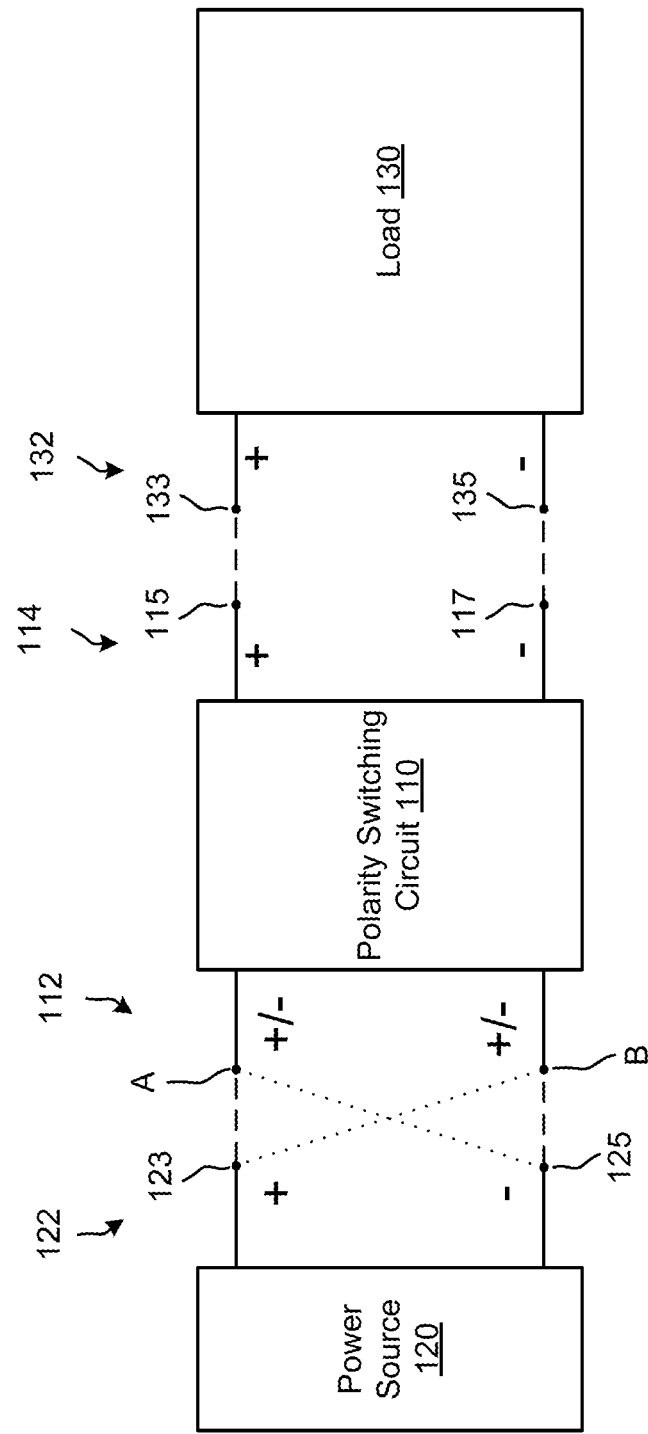
FIG. 1 is a block diagram that illustrates a polarity switching circuit, according to an embodiment.

FIG. 1 is a block diagram that illustrates a polarity switching circuit 110, according to an embodiment. The polarity switching circuit 110 is configured to switch a polarity of power (e.g., current, voltage) provided by a power source 120 to a load 130. Specifically, the polarity switching circuit 110 is configured to provide the proper polarity to the load 130 regardless of the polarity of power provided by the power source 120. Without the polarity switching provided by the polarity switching circuit 110, the power source 120 could be coupled to the load 130 with a reverse polarity that could cause, for example, damage to the load 130. In other words, the polarity switching circuit 110 can function as a protection component that allows for the power source 120 to be inadvertently installed or coupled with a reverse polarity. In some embodiments, the polarity switching circuit 110 can be included as an input to the load 130 so that the load 130 and the polarity switching circuit 110 can collectively function as a device that can receive an output from a power source (such as power source 120) with any polarity configuration (e.g., function as a polarity indiscriminate device).

As shown in FIG. 1, the polarity switching circuit 110 includes polarity insensitive inputs 112 (also can be referred to as polarity insensitive input nodes) and fixed polarity outputs 114 (also can be referred to as fixed polarity output nodes). The polarity insensitive inputs 112 are represented as polarity insensitive inputs by the "+/−" label. The polarity insensitive inputs 112 will be referred to as polarity insensitive input A and polarity insensitive input B to distinguish them from one another (because they are essentially functionally equivalent in this embodiment). The fixed polarity outputs 114, which are each represented as fixed polarity outputs by the "+" (i.e., positive) or the "−" (i.e., negative) label, will be referred to by their polarity as positive fixed polarity output 115 and as negative fixed polarity output 117.

The fixed polarity outputs 114 are configured to be coupled to load inputs 132 of the load 130, which include positive load input 133 (represented with the "+" label) and negative load input 135 (represented with the "−" label). Specifically, positive fixed polarity output 115 is configured to be coupled to positive load input 133, and negative fixed polarity output 117 is configured to be coupled to negative load input 135. The fixed polarity outputs 114 are referred to as being fixed because they produce a fixed polarity (e.g., a fixed positive output or a fixed negative output). The power outputs 122 of the power source 120 are configured to be coupled to the polarity insensitive inputs 112. The power outputs 122 include positive power output 123 (represented with the "+" label) and negative power output 125 (represented with the "−" label).

As represented in FIG. 1, when the power outputs 122 are coupled to the polarity insensitive inputs 112 in accordance with the dashed lines (which represents one polarity orientation) or the dotted lines (which represents another polarity orientation), the polarity switching circuit 110 is configured to provide a positive power output (from the power source 120) to the positive power input 133 of the load 130 and a negative power output (from power source 120) to the negative power input 135 of the load 130. As a specific example, when negative power output 125 is coupled to power insensitive input A and positive power output 123 is coupled to power insensitive input B, the polarity switching circuit 110 is configured to provide power having a positive polarity to the positive load input 133 and power having a negative polarity to the negative load input 135. When the polarity of the power source 120 is switched so that the negative power output 125 is coupled to power insensitive input B and the positive power output 123 is coupled to power insensitive input A, the polarity switching circuit 110 is configured to continue to provide power having a positive polarity to the positive load input 133 and power having a negative polarity to the negative load input 135.

The polarity switching circuit 110 can be, or can include, a bridge rectifier including metal-oxide-semiconductor field effect transistor (MOSFET) devices rather than, for example, diodes. In some embodiments, the bridge rectifier can be a relatively high efficiency (e.g., greater than 95% efficiency) bridge rectifier. In some embodiments, the MOSFET devices can be relatively low resistance power MOSFET devices. In some embodiments, the resistance of the MOSFET devices can be approximately 0.1 ohms or less (e.g., 0.05 ohms, 0.01 ohms). In some embodiments, the resistance of the MOSFET devices can be greater than 0.1 ohms (e.g., 0.5 ohms).

In some embodiments, one or more MOSFET devices included in the polarity switching circuit 110 can have a gate input (e.g., gate-to-source input) configured to handle (without failing) a relatively high voltage. In other words, one or more MOSFET devices included in the polarity switching circuit 110 can have a relatively high gate input voltage rating. For example, a MOSFET device included in the polarity switching circuit 110 can have a gate input configured to handle an input voltage approximately equal to (and/or exceeding) a maximum output voltage of the power source 120. In some embodiments, the voltage rating of the gate input can be greater than or equal to 20 volts (V) (e.g., 25 V, 30 V, 40 V, 50 V). In some embodiments, the gate input voltage rating of the MOSFET device can be greater than or equal to a source to drain voltage rating of the MOSFET device.

In some embodiments, one or more MOSFET devices included in the polarity switching circuit 110 can be configured with a gate dielectric (e.g., gate oxide) thickness that enables the MOSFET device(s) to handle a relatively high gate input voltage (and/or power level). In some embodiments, a MOSFET device included in the polarity switching circuit 110 can have a gate oxide thickness (which can, in some embodiments, be any type of gate dielectric) configured so that the MOSFET device can handle an input voltage approximately equal to (and/or exceeding) a maximum output voltage of the power source 120. In some embodiments, the gate oxide thickness of the MOSFET device can be greater than 5 nanometers (nm) (e.g., 15 nm, 50 nm to 300 nm).

In some embodiments, the polarity switching circuit 110 can include, for example, a voltage limiter circuit (e.g., an integrated gate-source voltage limiter) with a series resistor. In some embodiments, the voltage limiter circuit can be configured to control (e.g., limit) one or more voltages (e.g., gate-to-source voltages) within the polarity switching circuit 110 during operation of the polarity switching circuit 110. In such embodiments, MOSFET devices included in the polarity switching circuit 110 may not have a thick gate dielectric.

In some embodiments, the polarity switching capabilities provided by the polarity switching circuit 110 can be integrated into a single package so that the polarity switching circuit 110 is a standalone, discrete component. In other words, MOSFET devices, resistors, zener diodes, and/or other components included in the polarity switching circuit 110 can be integrated into a single package. In such embodiments, the single integrated component can have (e.g., can only have) the four terminals shown in FIG. 1—the polarity insensitive inputs 112 and the fixed polarity outputs 114. In some embodiments, portions of the polarity switching circuit 110 can be integrated into multiple discrete packages, on a single integrated circuit, and/or so forth.

In some embodiments, the number of components included in the polarity switching circuit 110 can be less than the number and/or complexity of components used in known polarity switching circuits with polarity switching functionality. The additional components used in such known polarity switching circuits can result in inefficiencies and/or power consumption that are greater than that of polarity switching circuit 110.

In some embodiments, the polarity switching circuit can be used in a variety of applications (e.g., direct current (DC) power source applications, alternating current (AC) applications with an AC power source). In some embodiments, the polarity switching circuit 110 can function as part of an input circuit to one or more devices associated with a Power over Ethernet (PoE) application and/or a wireless access point. Accordingly, the load 130 can be, or can include, various types of components. For example, the load 130 can be any type of circuit (or portion thereof) configured to operate based on power provided by the power source 120. For example, the load 130 can be a microprocessor, a logic module, a radio-frequency (RF) amplifier, a PoE input circuit, a digital signal processor (DSP), a logic gate, an application-specific integrated circuit (ASIC), a field programmable gate array (FPGA), and/or so forth. In some embodiments, the load 130 can be any combination of a digital circuit and an analog circuit. Example architectures of the polarity switching circuit 110, and operation thereof, are described in connection with the figures below.

Figure 2:
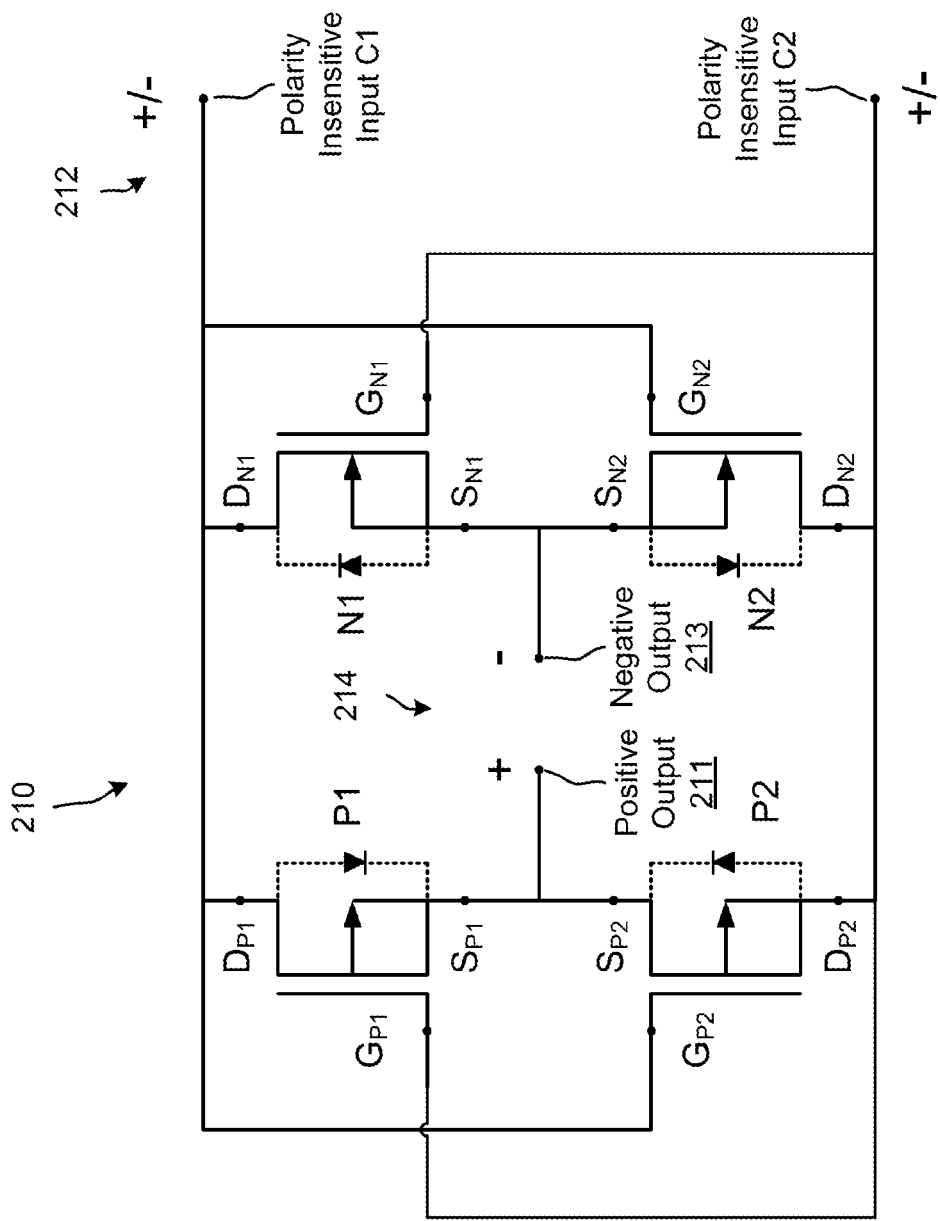
FIG. 2 is a circuit diagram that illustrates a polarity switching circuit, according to an embodiment.

FIG. 2 is a circuit diagram that illustrates a polarity switching circuit 210, according to an embodiment. As shown in FIG. 2, the polarity switching circuit 210 includes two N-channel MOSFET devices, MOSFET device N1 and MOSFET device N2, and two P-channel MOSFET devices, MOSFET device P1 and MOSFET device P2. In this embodiment, the MOSFET devices can be referred to as devices. For example, MOSFET device P1 can be referred to as device P1. The polarity switching circuit 210 includes fixed polarity outputs 214 (i.e., a positive fixed output 211 and a negative fixed output 213) and polarity insensitive inputs 212 (polarity insensitive input C1 and polarity insensitive input C2). As shown in FIG. 2, the MOSFET devices N1, N2, P1, and P2 each include a body diode (represented by the diode connected by the dashed lines). In some embodiments, the MOSFET devices N1, N2, P1, and P2 included in the polarity switching circuit 210 can be collectively referred to as MOSFET devices of the polarity switching circuit 210.

As shown in FIG. 2, the device N2 has a source $S_{N2}$ coupled to (e.g., defining at least a portion of, directly coupled to without intervening components, coupled via one or more intervening components) the negative fixed output 213, and the device N1 also has a source $S_{N1}$ coupled to (e.g., defining at least a portion of, directly coupled to without intervening components, coupled via one or more intervening components) the negative fixed output 213. The device P1 has a source $S_{P1}$ coupled to (e.g., defining at least a portion of, directly coupled to without intervening components, coupled via one or more intervening components) the positive fixed output 211 and the device P2 also has a source $S_{P2}$ coupled to (e.g., defining at least a portion of, directly coupled to without intervening components, coupled via one or more intervening components) the positive fixed output 211.

The drain $D_{P1}$ of device P1, the gate $G_{P2}$ of the device P2, the drain $D_{N1}$ of device N1, and the gate $G_{N2}$ of the device N2 are coupled to (e.g., defining at least a portion of, directly coupled to without intervening components) the polarity insensitive input C1. Also, the drain $D_{P2}$ of device P2, the gate $G_{P1}$ of the device P1, the drain $D_{N2}$ of device N2, and the gate $G_{N1}$ of the device N1 are coupled to (e.g., defining at least a portion of, directly coupled to without intervening components) the polarity insensitive input C2.

The fixed polarity outputs 214 are configured to provide power with the polarities shown in FIG. 2 regardless of the polarity of a power source (not shown) coupled to the polarity insensitive inputs 212. In other words the output polarities of the polarity switching circuit 210 are fixed. The basic operation of the polarity switching circuit 210 is as follows.

When a positive terminal of a power source (not shown) is coupled to the polarity insensitive input C1 and a negative terminal of the power source is coupled to the polarity insensitive input C2, device N2 will be turned on (e.g., conducting, closed, activated) and device N1 will be turned off (e.g., not conducting, open, deactivated). Device N2 will be turned on because the gate-to-source voltage (from gate $G_{N2}$ to drain $D_{N2}$) of device N2 can be equal to (or approximately equal to) the voltage of the power source (which is assumed to be larger than the threshold voltage of device N2). Accordingly, the negative fixed output 213 will be electrically coupled, via device N2, to the negative terminal of the power source, which is coupled to the polarity insensitive input C2. Also, when the positive terminal of the power source is coupled to the polarity insensitive input C1 and the negative terminal of the power source is coupled to the polarity insensitive input C2, device P1 will be turned on and device P2 will be turned off. Device P1 will be turned on because the gate-to-source voltage (from gate $G_{P1}$ to drain $D_{P1}$) of device P1 can be equal to (or approximately equal to) the negative voltage of the power source (which is assumed to be larger than the threshold voltage of device P1). Accordingly, the positive fixed output 211 will be electrically coupled, via device P1, to the positive terminal of the power source, which is coupled to the polarity insensitive input C1.

When the polarity of the power source is reversed, the positive fixed output 211 will continue to be electrically coupled to the positive terminal of the power source, and the negative fixed output 213 will still be electrically coupled to the negative terminal of the power source. Specifically, when the positive terminal of the power source is coupled to the polarity insensitive input C2 and the negative terminal of the power source is coupled to the polarity insensitive input C1, device N2 (which was previously turned on) will be turned off and device N1 (which was previously turned on) will be turned off. Device N1 will be turned on because the gate-to-source voltage (from gate $G_{N1}$ to drain $D_{N1}$) of device N1 can be equal to (or approximately equal to) the voltage of the power source (which is assumed to be larger than the threshold voltage of device N1). Accordingly, the negative fixed output 213 will be electrically coupled, via device N1 (rather than device N2), to the negative terminal of the power source, which is coupled to the polarity insensitive input C1 (rather than polarity insensitive input C1). Also, when the positive terminal of the power source is coupled to the polarity insensitive input C2 and the negative terminal of the power source is coupled to the polarity insensitive input C1, device P1 (which was previously turned on) will be turned off and device P2 (which was previously turned off) will be turned on. Device P2 will be turned on because the gate-to-source voltage (from gate $G_{P2}$ to drain $D_{P2}$) of device P2 can be equal to (or approximately equal to) the negative voltage of the power source (which is assumed to be larger than the threshold voltage of device P2). Accordingly, the positive fixed output 211 will be electrically coupled, via device P2 (rather than device P1), to the positive terminal of the power source, which is coupled to the polarity insensitive input C2 (rather than polarity insensitive input C1).

In some embodiments, one or more of the MOSFET devices of the polarity switching circuit 210 can be configured with a gate dielectric (e.g., gate oxide) thickness that enables the MOSFET device(s) to handle a relatively high gate input voltage (and/or power level). In some embodiments, one or more of the MOSFET devices of the polarity switching circuit 210 can have a gate oxide thickness configured so that the MOSFET device(s) of the polarity switching circuit 210 can handle an input voltage approximately equal to (and/or exceeding) a maximum output voltage of a power source (not shown). One or more of the MOSFET devices of the polarity switching circuit 210 may be configured to handle an input voltage equal to (and/or exceeding) the maximum output voltage of the power source because during operation of the polarity switching circuit 210, the gate-to-source voltages of at least two of the MOSFET devices of the polarity switching circuit 210 will be at (or nearly at) a voltage (e.g., a negative voltage, a positive voltage) across the power source. In some embodiments, the gate oxide thicknesses of one or more of the MOSFET devices of the polarity switching circuit 210 can be much greater than 5 nm (e.g., 15 nm, 50 nm to 300 nm). In some embodiments, the gate oxide thicknesses of one or more of the MOSFET devices of the polarity switching circuit 210 can be approximately equal to one another, or can be different. In some embodiments, one or more of the MOSFET devices of the polarity switching circuit 210 can be configured with a gate oxide thickness that can handle a gate-to-source voltage greater than 20 V (e.g., 30 V, 40 V 50 V, 100 V).

In some embodiments, the polarity switching circuit 210 can be integrated into a single package so that the polarity switching circuit 210 is a standalone, discrete component. In other words, the MOSFET devices of the polarity switching circuit 210 can be processed on a single substrate, or multiple substrates, and then integrated into a single package. In such embodiments, the single integrated component can have (e.g., can only have) the four terminals shown in FIG. 2—the polarity insensitive inputs 212 and the fixed polarity outputs 214. An example of a package integrated device is described in connection with, for example, FIG. 4.

Because the polarity switching circuit 210 can be used in direct current (DC) power source applications where the power source may not be switched at a high frequency or may be coupled to the polarity switching circuit 210 only once, an increase in gate oxide thickness may not have an undesirable effect. In some embodiments, features of one or more of the MOSFET devices polarity switching circuit 210 can be the same as the features of a high-performance MOSFET device, in some examples, except for the increase in gate oxide thickness. For example, features (e.g., on-resistance ($R_{DS}$ on), doping levels, capacitance, threshold voltage) of the MOSFET device N1, except for the gate oxide thickness, can be optimized for a relatively high performance MOSFET device with a thin gate oxide. In other words, a MOSFET device configured for high performance (e.g., high switching performance) can be used in the polarity switching circuit 210 by increasing the thickness of the oxide of the MOSFET device for a desirable voltage rating. Said differently, the MOSFET device (including the gate oxide thickness) can be tuned for high-performance (e.g., high-performance switching). After the MOSFET device has been tuned, the gate oxide thickness can be increased (e.g., increased for a desirable voltage rating) for use in the polarity switching circuit 210. In some embodiments, a MOSFET device having a relatively thick gate oxide can have performance characteristics that are similar to a MOSFET device having a relatively thin gate oxide.

In some embodiments, the basic operation of the polarity switching circuit 210 shown in FIG. 2 can be summarized in the following table:

| Input | N1 | N2 | P1 | P2 | Output |
|---|---|---|---|---|---|
| C1 Positive, C2 Negative | OFF | ON | ON | OFF | Positive output 211 is positive through P1 and negative output 213 is negative through N2 |
| C2 Positive, C1 Negative | ON | OFF | OFF | ON | Positive output 211 is positive through P2 and negative output 213 is negative through N1 |

FIGS. 3A through 3H are graphs that collectively illustrate operation of the polarity switching circuit 210 shown in FIG. 2. Time is increasing to the right in FIGS. 3A through 3H.

Although the behavior of the components of the polarity switching circuit 210 are described in connection with FIGS. 3A through 3H as making transitions at specified times, voltages, and so forth, when implemented (e.g., implemented using MOSFET devices), the transitions of the components may occur slightly before or slightly after the specified voltages and/or specified times. Specifically, variations in threshold voltages, processing variations, temperature variations, switching times of devices, circuit transition delays, and/or so forth can result in conditions (e.g., non-ideal conditions) that can trigger transitions of components of the polarity switching circuit 210 slightly before or slightly after the specified voltages and/or times. Also, some non-idealities such as noise (e.g., switching noise), drift, and/or so forth, are not depicted in these graphs.

As shown in FIGS. 3A and 3B, respectively, a positive terminal of a power source is coupled to polarity insensitive input C1 and a negative terminal of the power source is coupled to polarity insensitive input C2 starting at time T1. As shown in FIGS. 3C and 3D, respectively, MOSFET device N1 is turned off and MOSFET device N2 is turned on. Accordingly, as shown in FIG. 3G, the polarity at the positive fixed output (positive fixed output 211), via MOSFET device N2, is the same positive polarity as that of the polarity insensitive input C1. As shown in FIGS. 3E and 3F, respectively, MOSFET device P1 is turned on and MOSFET device P2 is turned off. Accordingly, as shown in FIG. 3H, the polarity at the negative fixed output (i.e., negative fixed output 213), via MOSFET device P1, is the same negative polarity as that of the polarity insensitive input C2.

At time T2, the polarity of the power source is reversed. In some embodiments, the power source can be referred to as being in a first polarity orientation (e.g., a forward polarity orientation) with respect to the polarity switching circuit 210 during before time T1 and can be referred to as being in a second polarity orientation (e.g., a reversed polarity orientation) with respect to polarity switching circuit 210 after time T2. As shown in FIGS. 3A and 3B, respectively, the positive terminal of the power source is coupled to polarity insensitive input C2 and the negative terminal of the power source is coupled to polarity insensitive input C1 at time T2. As shown in FIGS. 3C and 3D, respectively, MOSFET device N1 is turned on and MOSFET device N2 is turned off in response to the reversing of the power source. Accordingly, as shown in FIG. 3G, the polarity at the positive fixed output (i.e., positive fixed output 211) remains the same positive polarity as that of the polarity insensitive input C2 (rather than polarity insensitive input C1) via MOSFET device N1 (rather than MOSFET device N2). Also, as shown in FIGS. 3E and 3F, respectively, MOSFET device P1 is turned off and MOSFET device P2 is turned on. Accordingly, as shown in FIG. 3H, the polarity at the negative fixed output (i.e., negative fixed output 213) remains the same negative polarity as that of the polarity insensitive input C1 (rather than polarity insensitive input C2) via MOSFET device P2 (rather MOSFET device P1).

Figure 4:
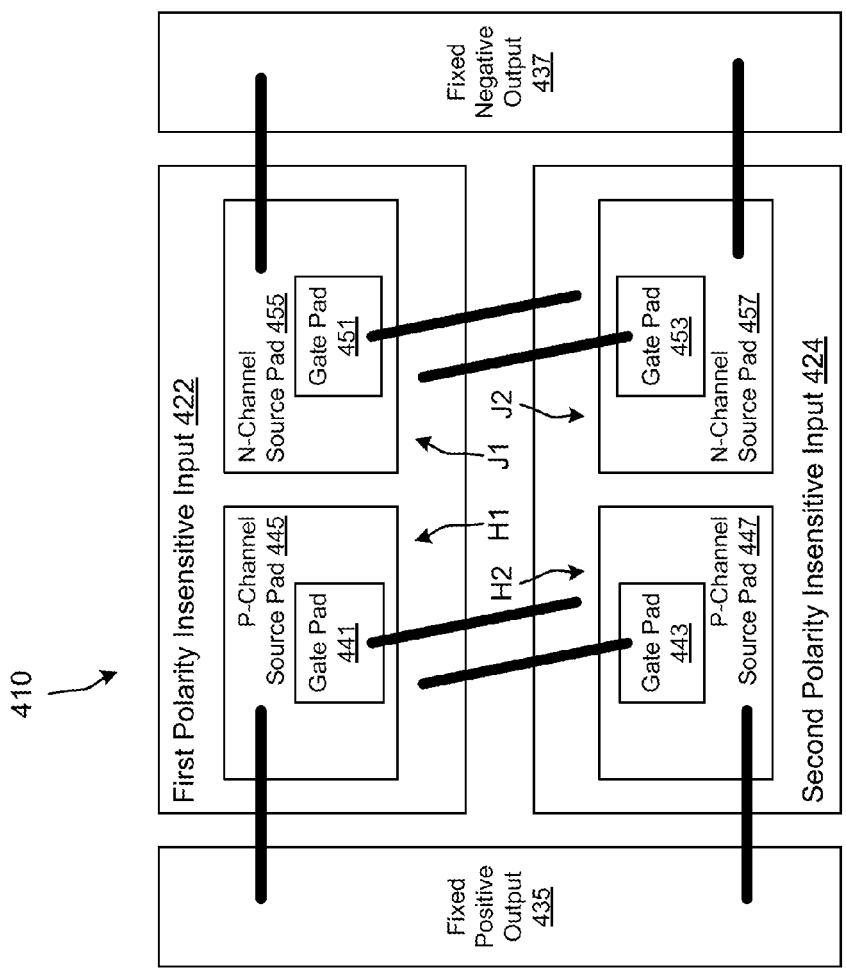
FIG. 4 is a schematic block diagram of a top view of a layout of a polarity switching circuit, according to an embodiment.

FIG. 4 is a schematic block diagram of a top view of a layout of a polarity switching circuit 410, according to an embodiment. The layout of the polarity switching circuit 410 shown in FIG. 4 can be used to implement the polarity switching circuits described above (e.g., polarity switching circuit 210 shown in FIG. 2). The polarity switching circuit 410 can be packaged as a single, discrete component.

As shown in FIG. 4, the sources of P-channel MOSFET device H1 and P-channel MOSFET device H2 (which can each include one or more vertical MOSFET devices) are coupled to a fixed positive output 435 (also can be referred to as a fixed positive output terminal) via P-channel source pad 445 and P-channel source pad 447 (and via interconnect (e.g., wires, interconnect portions) represented by dark lines), respectively. Similarly, the sources of N-channel MOSFET device J1 and N-channel MOSFET device J2 (which can each include one or more vertical MOSFET devices) are coupled to a fixed negative output 437 (also can be referred to as a fixed negative output terminal) via N-channel source pad 455 and N-channel source pad 457 (and via interconnect represented by dark lines), respectively. The MOSFET devices H1, H2, J1, and/or J2 can be vertical MOSFET devices (e.g., trench MOSFET devices). In other words, the MOSFET devices H1, H2, J1, and/or J2 can be vertically-oriented MOSFET devices.

Also, the drains (e.g., drain pads) of device H1 and device J1, which are not shown in FIG. 4 because they are disposed below device H1 and device J1 (because devices H1 and J1 can be vertical MOSFET devices), are coupled to the first polarity insensitive input 422 (also can be referred to as a first polarity insensitive input terminal). Similarly, the drains of device H2 and device J2, which are not shown in FIG. 4 because they are disposed below device H2 and device J2 (because devices H2 and J2 can be vertical MOSFET devices), are coupled to the first polarity insensitive input 424.

The gates of each of the MOSFET devices of the polarity switching circuit 410 are also each coupled to the polarity insensitive inputs. Specifically, gate pad 441 and gate pad 451 are coupled to the second polarity insensitive input 424 (via interconnect represented by dark lines) (also can be referred to as a second polarity insensitive input terminal), and gate pad 443 and gate pad 453 are coupled to the first polarity insensitive input 422 (via interconnect represented by dark lines).

The first polarity insensitive input 422, the second polarity insensitive input 424, the fixed positive output 435, and the fixed negative output 437 can each be leads that collectively define a lead frame (e.g., a four-terminal lead frame). In other words, these inputs and outputs can define terminals of the polarity switching circuit 410.

Figure 5:
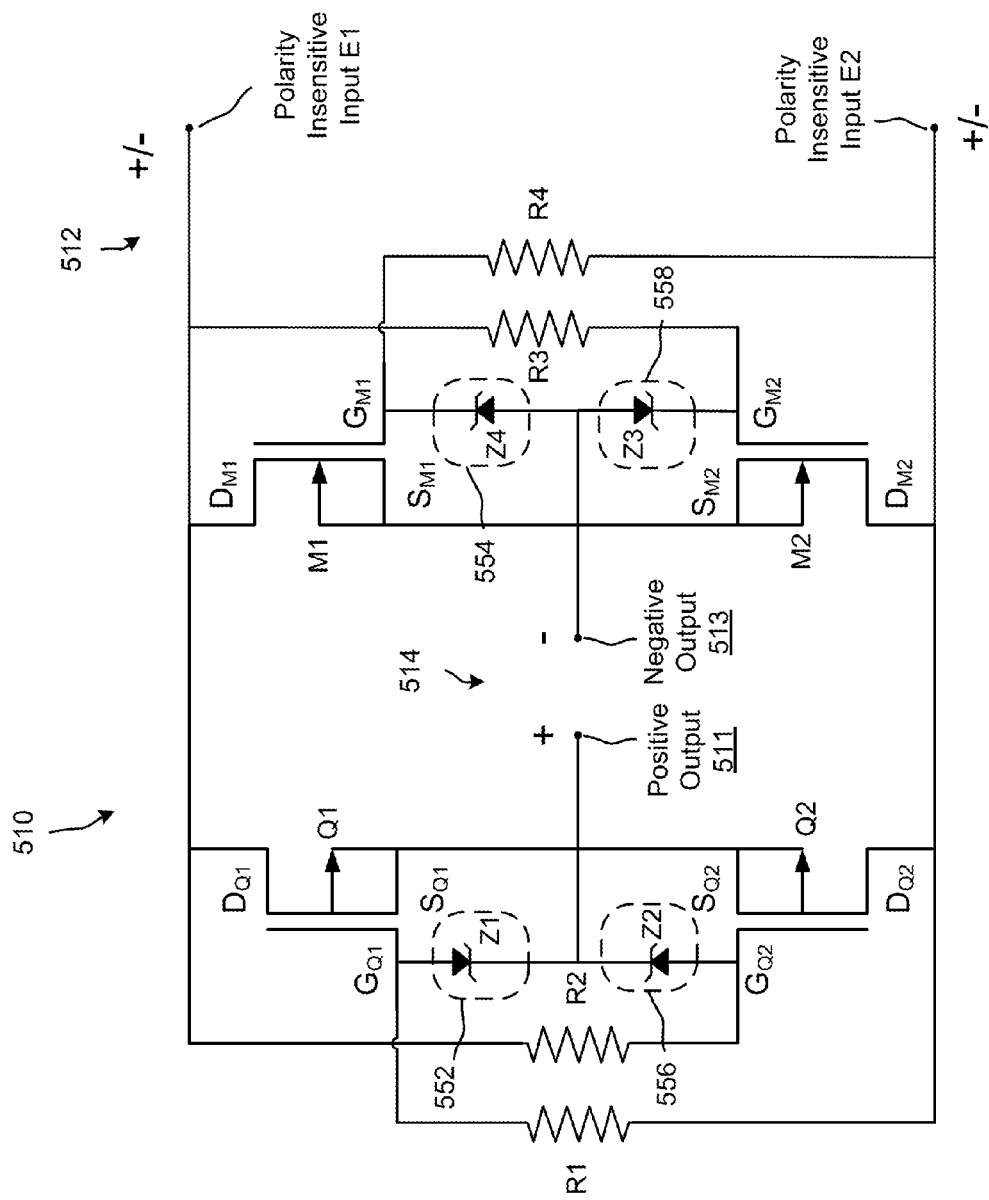
FIG. 5 is a circuit diagram that illustrates a polarity switching circuit, according to an embodiment.

FIG. 5 is a circuit diagram that illustrates a polarity switching circuit 510, according to an embodiment. As shown in FIG. 5, the polarity switching circuit 510 includes two N-channel MOSFET devices, MOSFET device M1 and MOSFET device M2, and two P-channel MOSFET devices, MOSFET device Q1 and MOSFET device Q2. In this embodiment, the MOSFET devices can be referred to as devices. For example, MOSFET device Q1 can be referred to as device Q1. The polarity switching circuit 510 includes fixed polarity outputs 514 (i.e., a positive fixed output 511 and a negative fixed output 513) and polarity insensitive inputs 512 (polarity insensitive input E1 and polarity insensitive input E2). In some embodiments, the MOSFET devices M1, M2, Q1, and/or Q2 included in the polarity switching circuit 510 can be collectively referred to as MOSFET devices of the polarity switching circuit 510. The body diodes of the MOSFET devices M1, M2, Q1, and/or Q2 are not shown in FIG. 5. The basic operation of the MOSFET devices included in the polarity switching circuit 510 is similar to the basic operation of the MOSFET devices included in the polarity switching circuit 210 shown in FIG. 2.

As shown in FIG. 5, the device M2 has a source $S_{M2}$ coupled to (e.g., defining at least a portion of, directly coupled to without intervening components, coupled via several intervening components) the negative fixed output 513, and the device M1 also has a source $S_{M1}$ coupled to (e.g., defining at least a portion of, directly coupled to without intervening components) the negative fixed output 513. The device Q1 has a source $S_{M1}$ coupled to (e.g., defining at least a portion of, directly coupled to without intervening components) the positive fixed output 511 and the device Q2 also has a source $S_{Q2}$ coupled to (e.g., defining at least a portion of, directly coupled to without intervening components) the positive fixed output 511. The drain $D_{Q1}$ of device Q1 and the drain $D_{M1}$ of device M1 are coupled to (e.g., defining at least a portion of, directly coupled to without intervening components) the polarity insensitive input E1. Also, the drain $D_{Q2}$ of device Q2 and the drain $D_{M2}$ of device M2 are coupled to (e.g., defining at least a portion of, directly coupled to without intervening components) the polarity insensitive input E2.

As shown in FIG. 5, the gates of the MOSFET devices of the polarity switching circuit 510 are each coupled to at least one polarity insensitive input via a resistor (e.g., one of resistors R1 through R4). For example, gate $G_{Q1}$ of the device Q1 is coupled to polarity insensitive input E2 via resistor R1. Similarly, gate $G_{M1}$ of the device M1 is coupled to polarity insensitive input E2 via resistor R4.

As shown in FIG. 5, the gate-to-source of each of the MOSFET devices is coupled to a voltage limiter circuit (e.g., one of voltage limiter circuits 552 through 558). In this embodiment, each of the voltage limiter circuits 552 through 558 includes at least one zener diode. The zener diodes are each configured to function as clamping diodes.

In some embodiments, one or more of the voltage limiter circuits 552 through 558 can include multiple zener diodes. For example, one or more of the voltage limiter circuits 552 through 558 can include two zener diodes where an anode of one zener diode is coupled to an anode of another zener diode.

In some embodiments, the voltage limiter circuits 552 through 558 can include more than two zener diodes and/or can include other types of components (e.g., diodes, resistors, capacitors, inductors).

The fixed polarity outputs 514 are configured to provide power with the polarities shown in FIG. 5 regardless of the polarity of a power source (not shown) coupled to the power insensitive inputs 512. The basic operation of the polarity switching circuit 510 is as follows.

When a positive terminal of a power source (not shown) is coupled to the polarity insensitive input E1 and a negative terminal of the power source is coupled to the polarity insensitive input E2, device M2 will be turned on (e.g., conducting, closed, activated) and device M1 will be turned off (e.g., not conducting, open, deactivated). Accordingly, the negative fixed output 513 will be electrically coupled, via device M2, to the negative terminal of the power source, which is coupled to the polarity insensitive input E2.

In this scenario, the voltage limiter circuit 558 can be configured so that the gate-to-source voltage (from gate $G_{M2}$ to drain $D_{M2}$) of device M2 will be permitted to be greater than a threshold voltage (e.g., gate threshold voltage) of the device M2 when the power source is coupled to the polarity insensitive inputs E1, E2 as described above. However, the voltage limiter circuit 558 can be configured so that the gate-to-source voltage will be limited to (e.g., clamped below) a voltage below a voltage rating of the gate of the device M2. Specifically, the voltage limiter circuit 558 can be configured to limit (e.g., control) a gate-to-source voltage of device M2 to a breakdown voltage of zener diode Z3. The voltage limiter circuit 558 will operate as a limiter (while allowing device M2 to turn on) when the voltage across the power source is larger than the threshold voltage of device M2 and larger than the breakdown voltage of zener diode Z3.

Also, when the positive terminal of the power source is coupled to the polarity insensitive input E1 and the negative terminal of the power source is coupled to the polarity insensitive input E2, device Q1 will be turned on and device Q2 will be turned off. Accordingly, the positive fixed output 511 will be electrically coupled, via device Q1, to the positive terminal of the power source, which is coupled to the polarity insensitive input E1. The operation of the voltage limiter circuit 552 with respect to the gate-to-source voltage of device Q1 is similar to the operation of the voltage limiter circuit 558 with respect to the gate-to-source voltage of device M2 as described above. Specifically, the voltage limiter circuit 552 can be configured to limit (e.g., control) a gate-to-source voltage of device Q1 to a breakdown voltage of zener diode Z1.

The resistors R1 through R4 can be configured to limit (e.g., control) current flow through the voltage limiter circuits 552 through 558 when, for example, device Q1 and device M2 are turned on. For example, the resistor R3 can limit current flow from polarity insensitive input E1 through zener diode Z3 to negative output 513. Thus, power consumption of the polarity switching device 510 can be limited by the resistors R1-R4. In some embodiments, the resistors R1 through R4 can have resistances between several thousand ohms ($\Omega$) (e.g., 5 k$\Omega$, 10 k$\Omega$, 50 k$\Omega$, 500 k$\Omega$) and several megaohms (M$\Omega$) (e.g., 1 M$\Omega$, 2 M$\Omega$, 10 M$\Omega$, 20 M$\Omega$). In some embodiments, the resistors R1 through R4 can have the same resistance value (or substantially the same value), or can have different resistance values. For example, resistor R1 can have a different resistance value than resistor R2. In some embodiments, the resistors R1 through R4 can be considered components within the voltage limiter circuits 552 through 558, respectively.

In some embodiments, the zener diodes Z1 through Z4 can have the same (or substantially the same) breakdown voltage. In some embodiments, the zener diode Z1, which is associated with P-channel MOSFET device, can have a breakdown voltage that is different than a breakdown voltage of the zener diode Z3, which is associated with an N-channel MOSFET device.

Because the polarity switching circuit 510 includes the voltage limiter circuits 552 through 558, the MOSFET devices of the polarity switching circuit 510 can have a gate oxide voltage ratings lower than would be possible without the voltage limiter circuits 552 through 558. In some embodiments, one or more of the MOSFET devices of the polarity switching circuit 510 can be configured with a gate dielectric (e.g., gate oxide) thickness that enables the MOSFET device(s) to handle a relatively high gate input voltage (and/or power level). In such embodiments, the voltage limiter circuits 552 through 558 can be configured to limit the gate voltages of the MOSFET devices of the polarity switching circuit 510 to a voltage below the gate oxide voltage ratings of each of MOSFET devices of the polarity switching circuit 510. In some embodiments, one MOSFET device of the polarity switching circuit 510 can have different gate oxide voltage rating than another MOSFET device of the polarity switching circuit 510. In some embodiments, the gate oxide thicknesses of one or more of the MOSFET devices of the polarity switching circuit 510 can be much greater than 5 nm (e.g., 15 nm, 50 nm to 300 nm). In some embodiments, the gate oxide thicknesses of one or more of the MOSFET devices of the polarity switching circuit 510 can be approximately equal to one another, or can be different. In some embodiments, one or more of the MOSFET devices of the polarity switching circuit 510 can be configured with a gate oxide thickness that can handle a gate-to-source voltage greater than 20 V (e.g., 30 V, 40 V, 50 V, 100 V).

In some embodiments, one or more of the MOSFET devices can have any combination of thick gate oxide and/or voltage limiter circuit. For example, a first MOSFET device (e.g., MOSFET device Q1) can have a gate oxide thickness that is greater than a gate oxide thickness of a second MOSFET device (e.g., MOSFET device Q2, MOSFET device M1, MOSFET device M2). In such embodiments, the first MOSFET device may not be coupled to (e.g., may not include, may exclude) a voltage limiter circuit, while the second MOSFET device may be coupled to a voltage limiter circuit. Alternatively, the first MOSFET device may be coupled to a voltage limiter circuit, while the second MOSFET device may not be coupled to (e.g., may not include, may exclude) a voltage limiter circuit.

Because the polarity switching circuit 510 includes the voltage limiter circuits 552 through 558, the MOSFET devices of the polarity switching circuit 510 can have a gate dielectric voltage ratings lower than would be possible without the voltage limiter circuits 552 through 558. Accordingly, one or more of the MOSFET devices of the polarity switching circuit 510 can be configured with a gate dielectric (e.g., gate oxide) thickness that is relatively thin. For example, the gate oxide thicknesses of one or more of the MOSFET devices of the polarity switching circuit 510 can be less than 15 nm (e.g., 5 nm, 10 nm). In such embodiments, characteristics of the MOSFET devices such as on-resistance can be improved (e.g., decreased). Although the gate ratings of the MOSFET devices with relatively thin gate dielectric may not have a high gate voltage rating, the voltage limiter circuits 552 through 558 can protect the gates of these MOSFET devices.

When the polarity of the power source is reversed, the positive fixed output 511 will still be electrically coupled to the positive terminal of the power source, and the negative fixed output 513 will still be electrically coupled to the negative terminal of the power source. Specifically, when the positive terminal of the power source is coupled to the polarity insensitive input E2 and the negative terminal of the power source is coupled to the polarity insensitive input E1, device M2 (which was previously turned on as described above) will be turned off and device M1 (which was previously turned on as described above) will be turned off. Accordingly, the negative fixed output 513 will be electrically coupled, via device M1 (rather than device M2 as described above), to the negative terminal of the power source, which is coupled to the polarity insensitive input E1 (rather than polarity insensitive input E2 as described above). The voltage limiter circuit 554 can be configured to control (e.g., limit) the gate-to-source voltage (from gate $G_{M1}$ to source $S_{M1}$) of device M1. The zener diode Z4 can function as a clamping diode.

Also, when the positive terminal of the power source is coupled to the polarity insensitive input E2 and the negative terminal of the power source is coupled to the polarity insensitive input E1, device Q1 (which was previously turned on as described above) will be turned off and device Q2 (which was previously turned off as described above) will be turned on. Accordingly, the positive fixed output 511 will be electrically coupled, via device Q2 (rather than device Q1 as described above), to the positive terminal of the power source, which is coupled to the polarity insensitive input E2 (rather than polarity insensitive input E1 as described above). The voltage limiter circuit 556 can be configured to control (e.g., limit) the gate-to-source voltage (from gate $G_{Q2}$ to source $S_{Q2}$) of device Q2. The zener diode Z2 can function as a clamping diode.

Because the polarity switching circuit 510 can be used in DC power source applications where the power source may not be switched at a high frequency or may be coupled to the polarity switching circuit 510 only once, a decrease in switching performance of one or more of the MOSFET devices of the polarity switching circuit 510 commensurate with the addition of the zener diodes, resistors, an increase in gate oxide thickness (or decrease), and/or so forth, may not have an undesirable effect. In some embodiments, features of one or more of the MOSFET devices polarity switching circuit 510 can be the same as the features of a high-performance MOSFET device (without an increased gate oxide thickness as discussed in connection with FIG. 2). For example, features (e.g., on resistance ($R_{DS}$on), doping levels, capacitance, threshold voltage, gain) of the MOSFET devices of the polarity switching circuit 510 can be optimized for a relatively high performance MOSFET device with a thin gate oxide.

Figure 6:
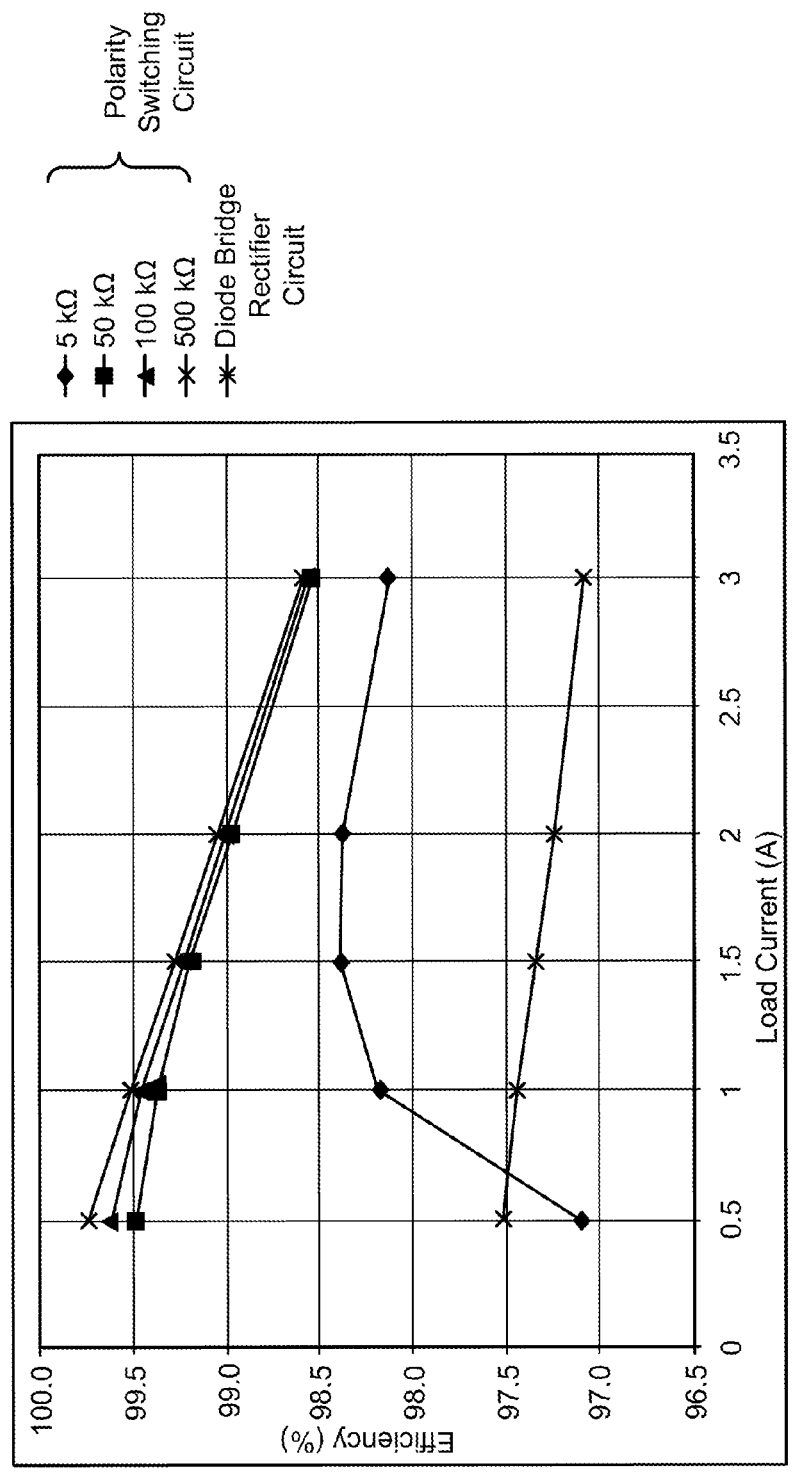
FIG. 6 is a graph that illustrates efficiency of the polarity switching circuit shown in FIG. 5 compared with a diode bridge rectifier circuit.

FIG. 6 is a graph that illustrates efficiency of the polarity switching circuit 510 shown in FIG. 5 compared with a diode bridge rectifier circuit. The graph illustrates percentage efficiency on the y-axis and load current (in amps) along the x-axis. Efficiencies of the polarity switching circuit 510 are shown with different values of resistors (e.g., resistors R1 through R4). As shown in FIG. 6, the efficiency of the polarity switching circuit 510 increases with increasing resistance values (from 5 kΩ to 500 kΩ). The graph also illustrates that the efficiency of the polarity switching circuit 510 is generally greater than the efficiency of the diode bridge rectifier circuit (except for the data point at a load current of 0.5 and resistance values of 6 kΩ). The graph illustrates that the efficiency of the diode bridge rectifier circuit and the polarity switching circuit 510 decreases with increasing load current.

Figure 7:
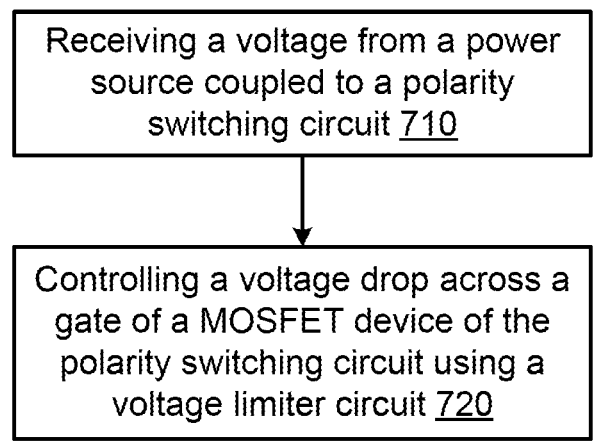
FIG. 7 is a flowchart that illustrates a method for operating a polarity switching circuit.

FIG. 7 is a flowchart that illustrates a method for operating a polarity switching circuit. As shown in FIG. 7, a voltage from a power source coupled to a polarity switching circuit can be received (block 710). In some embodiments, the power source can be coupled to the polarity switching circuit in a first polarity orientation or in a second polarity orientation.

A voltage drop across a gate of a MOSFET device of the polarity switching circuit is controlled using a voltage limiter circuit (block 720). In some embodiments, the voltage limiter circuit can include multiple zener diodes where at least one of the zener diodes is configured to function as a voltage clamp, and another of the zener diodes is configured to function as a forward biased diode. In some embodiments, the voltage limiter circuit can be coupled to at least one or more resistors. In some embodiments, the voltage drop across the gate of the MOSFET device can be clamped, at least in part, by a zener diode functioning in a breakdown mode.

Figure 8:
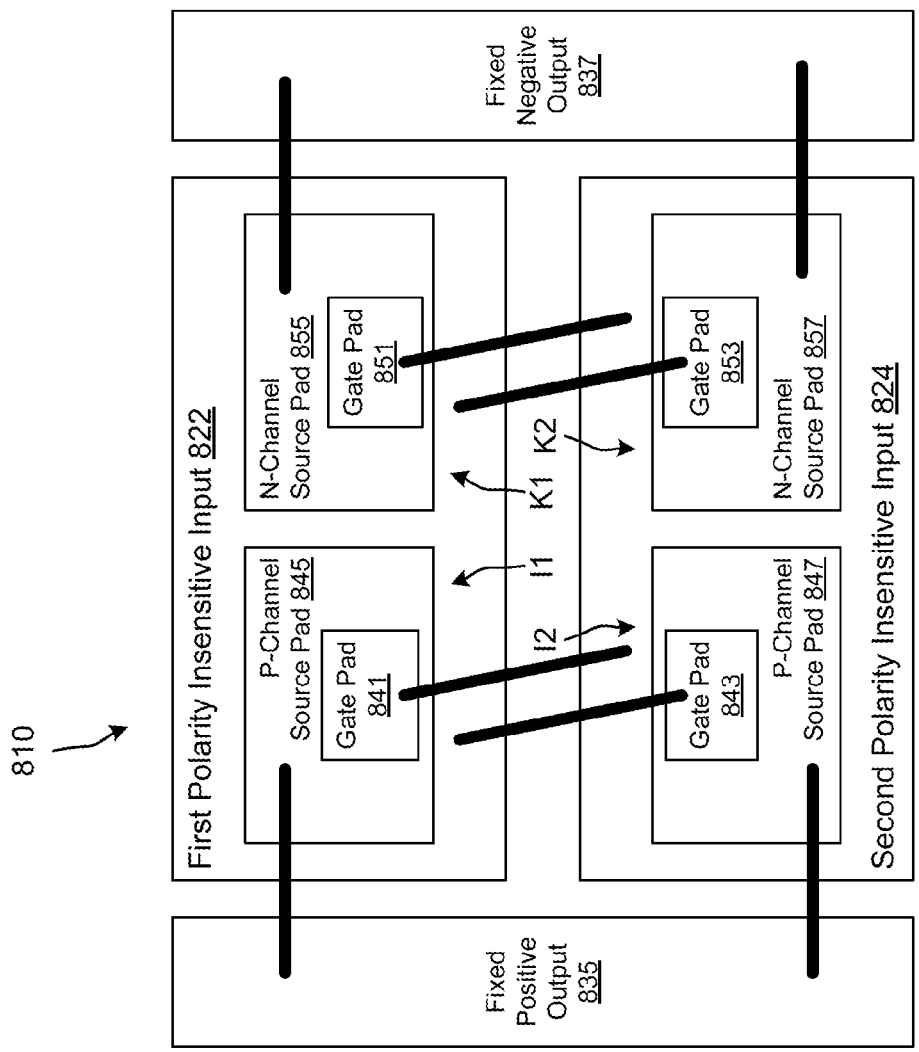
FIG. 8 is another schematic block diagram of a top view of a layout of a polarity switching circuit, according to an embodiment.

FIG. 8 is another schematic block diagram of a top view of a layout of a polarity switching circuit 810, according to an embodiment. The layout of the polarity switching circuit 810 shown in FIG. 8 can be used to implement the polarity switching circuits described above (e.g., polarity switching circuit 410 shown in FIG. 4). The polarity switching circuit 810, in some embodiments, can be packaged as a single, discrete component.

As shown in FIG. 8, the sources of P-channel MOSFET device I1 and P-channel MOSFET device I2 (which can each include one or more vertical MOSFET devices) are coupled to a fixed positive output 835 (also can be referred to as a fixed positive output terminal) via P-channel source pad 845 and P-channel source pad 847 (and via interconnect (e.g., wires) represented by dark lines), respectively. Similarly, the sources of N-channel MOSFET device K1 and N-channel MOSFET device K2 (which can each include one or more vertical MOSFET devices) are coupled to a fixed negative output 837 (also can be referred to as a fixed negative output terminal) via N-channel source pad 855 and N-channel source pad 857 (and via interconnect represented by dark lines), respectively. Also, the drains (not shown, but can be on the backside or bottom of the devices) of device I1 and device K1 are coupled to the first polarity insensitive input 822 (also can be referred to as a first polarity insensitive input terminal), and the drains (not shown, but can be on the backside or bottom of the devices) of device I2 and device K2 are coupled to the second polarity insensitive input 824.

The gates of each of the MOSFET devices of the polarity switching circuit 810 are also each coupled to the polarity insensitive inputs. Specifically, gate pad 841 and gate pad 851 are coupled to the second polarity insensitive input 824 (via interconnect represented by dark lines) (also can be referred to as a second polarity insensitive input terminal), and gate pad 843 and gate pad 853 are coupled to the first polarity insensitive input 822 (via interconnect represented by dark lines).

The first polarity insensitive input 822, the second polarity insensitive input 824, the fixed positive output 835, and the fixed negative output 837 can each be leads that collectively define a lead frame. In other words, these inputs and outputs can define terminals of the polarity switching circuit 810.

In this embodiment, components such as zener diodes and/or resistors (or portions thereof) (which can be part of a voltage limiter circuit) that are included in the polarity switching circuit 810 are connected between (e.g., disposed between) the gate pads and the source pads. For example, a zener diode (e.g., zener diode Z3 shown in FIG. 5) that functions as a clamping diode between the gate and source of N-channel MOSFET device K2 can be connected between gate pad 853 and N-channel source pad 857. Similarly, a resistor (e.g., resistor R3 shown in FIG. 7) that is coupled to the gate of N-channel MOSFET device K2 can be connect to gate pad 853. In some embodiments, one or more of the components can be included within a semiconductor substrate of the MOSFET devices, a polysilicon layer, and/or so forth, and can be produced during a semiconductor processing sequence.

Because components such as zener diodes and/or resistors may be coupled to a gate pad, the zener diodes and/or resistors may be coupled to a portion of the lead frame by the same interconnect (or set of interconnect) used to couple the gate pad to the portion of the lead frame. For example, the interconnect (or set of interconnect) used to couple the gate pad 853 to the first polarity insensitive input 822 also electrically couples zener diodes and/or resistors connected to the gate pad 853 to first polarity insensitive input 822.

In some embodiments, components such as zener diodes and/or resistors (which can be part of a voltage limiter circuit) that are incorporated in the polarity switching circuit 810 can be integrated using various processing techniques. For example, one or more resistors may be adjacent to (e.g., lateral to) the gate pad 853, the N-channel source pad 857, and/or the N-channel MOSFET device K2.

The integrated polarity switching circuits shown in FIGS. 4 and/or 8, are presented by way of example only. The orientation of the MOSFET devices, lead frames and/or components with respect to one another can be different those shown. Also, the components of the polarity switching circuit shown in FIGS. 4 and/or 8 may not be drawn to scale.

In some embodiments, multiple MOSFET devices (e.g., multiple MOSFET devices some of which can have a relatively thick gate dielectric) and voltage limiter circuits may be produced (e.g., separately produced) and then subsequently integrated into a single discrete component. For example, N-channel MOSFET device K2, which can have at least one component of a voltage limiter circuit coupled thereto, can be produced as a separate die (or component) from P-channel MOSFET device I2, which can have at least one component of voltage limiter circuit coupled thereto. The N-channel MOSFET device K2 (and voltage limiter circuit component coupled thereto) and P-channel MOSFET device I2 (and the voltage limiter circuit component coupled thereto) can be coupled to the second polarity insensitive input 824 for integration into the polarity switching circuit 810 as a single discrete component (or portion thereof).

Figure 9:
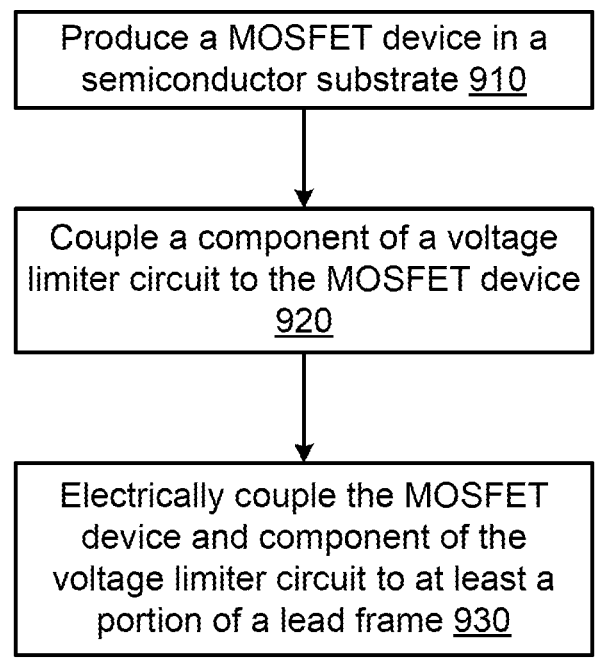
FIG. 9 is a flowchart that illustrates a method for producing at least a portion of a polarity switching circuit.

FIG. 9 is a flowchart that illustrates a method for producing at least a portion of a polarity switching circuit. As shown in FIG. 9, a MOSFET device is produced in a semiconductor substrate (block 910). In some embodiments, MOSFET device can be produced in a semiconductor substrate (e.g., a silicon substrate, a gallium arsenide substrate) using one or more semiconductor processing techniques (e.g., a deposition technique, an etching technique, a thermal processing technique, a polishing technique). The MOSFET device can be an N-channel MOSFET device or a P-channel MOSFET device.

A component of a voltage limiter circuit is coupled to the MOSFET device (block 920). In some embodiments, the portion of the voltage limiter circuit can include, for example, a zener diode, a resistor, and so forth. In some embodiments, the component of the voltage limiter circuit can be connected above the MOSFET device or adjacent to (e.g., lateral to) the MOSFET device using semiconductor processing techniques. In some embodiments, the component of the voltage limiter circuit can be connected between a gate pad of the MOSFET device and a source pad of the MOSFET device (or portion thereof). In some embodiments, the component of the voltage limiter circuit can be integrated into the semiconductor substrate that also includes the MOSFET device. In some embodiments, the MOSFET device, and the component(s) of voltage limiter circuit coupled thereto, can collectively be referred to as a functional MOSFET component of a polarity switching circuit. The functional MOSFET component can be formed within a single semiconductor substrate.

The MOSFET device and the component of the voltage limiter circuit are electrically coupled to at least a portion of a lead frame (block 930). In some embodiments, the component of the voltage limiter circuit and the MOSFET device may be coupled to the portion of lead frame via a single interconnect (e.g., wires, bond pads) (or set of interconnects). In some embodiments, the portion of lead frame can function as a fixed polarity output or as a polarity insensitive input. In some embodiments, multiple MOSFET device and voltage limiter circuits may be produced (e.g., separately produced) and then integrated into a single discrete component.

In some embodiments, the MOSFET device, the lead frame, the component of the voltage limiter circuit, and so forth may be integrated into a single discrete component. In other words, the MOSFET device, lead frame, component of the voltage limiter circuit, and so forth, may be included in a package with molding so that these components can function as a single discrete component. In some embodiments, the MOSFET device may be integrated into a single discrete component with other MOSFET devices that are also associated with voltage limiter circuits, lead frames, and so forth.

Implementations of the various techniques described herein may be implemented in digital electronic circuitry, or in computer hardware, firmware, software, or in combinations of them. Portions of methods may be performed by, and an apparatus (e.g., the input power protection device, the power management device) may be implemented within, special purpose logic circuitry, e.g., an FPGA (field programmable gate array) or an ASIC (application-specific integrated circuit).

Some implementations may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that appended claims, when included, are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
an n-channel metal-oxide-semiconductor field effect transistor (MOSFET) device, the n-channel MOSFET device being a vertical MOSFET device having a drain on a bottom portion of the n-channel MOSFET device and having a source pad on a top portion of the n-channel MOSFET device;
a p-channel MOSFET device having a drain on a bottom portion of the p-channel MOSFET device and having a source pad on a top portion of the p-channel MOSFET device;
a first lead frame portion defining a first polarity insensitive input, the drain of the n-channel MOSFET device and the drain of the p-channel MOSFET device both being disposed on the first lead frame portion;
a voltage limiter circuit disposed on top of the source pad of the n-channel MOSFET between the source pad and a gate pad of the n-channel MOSFET device, the voltage limiter circuit including a zener diode and a polysilicon resistor;
a second lead frame portion defining a second polarity insensitive input coupled to the gate bad of the n-channel MOSFET device via a first wire interconnect,
the zener diode, the polysilicon resistor and the n-channel MOSFET all being electrically connected to the second polarity insensitive input via the first wire interconnect and via the gate pad of the n-channel MOSFET device, the n-channel MOSFET device having a gate dielectric rating greater than twenty-five volts; and
a third lead frame portion defining a fixed polarity output coupled to the source pad of the n-channel MOSFET device via a second wire interconnect.

2. The apparatus of claim 1, wherein the n-channel MOSFET device has a gate voltage rating approximately equal to a drain-to-source voltage rating of the n-channel MOSFET device.

3. The apparatus of claim 1, wherein the n-channel MOSFET device is a first n-channel MOSFET device,
the apparatus further comprising:
a second n-channel MOSFET device having a source pad coupled to the fixed polarity output and a gate bad coupled to the first polarity insensitive input, the second n-channel MOSFET device being disposed on the second lead frame portion defining the second polarity insensitive input.

4. The apparatus of claim 1, wherein
the fixed polarity output is a first fixed polarity output, the source pad of the p-channel MOSFET device being coupled to a second fixed polarity output.

5. The apparatus of claim 1, wherein the gate dielectric has a thickness greater than 50 nanometers.

6. The apparatus of claim 1, wherein the first polarity insensitive input functions as an input for a power over Ethernet connection.

7. The apparatus of claim 1, wherein
the zener diode and the resistor are collectively configured to limit current through the voltage limiter circuit.

8. The apparatus of claim 1, wherein the drain of the n-channel MOSFET device, the source pad of the n-channel MOSFET device, and the voltage limiter are vertically disposed between the first lead frame portion and the gate pad.

9. The apparatus of claim 1, wherein the voltage limiter circuit consists of the zener diode and the polysilicon resistor.

10. The apparatus of claim 1, wherein the voltage limiter circuit is integrated into the n-channel MOSFET device.

11. An apparatus, comprising:
a lead frame including:
a fixed positive output terminal,
a fixed negative output terminal,
a first polarity insensitive input terminal, and
a second polarity insensitive input terminal;
a p-channel MOSFET device including a source pad on a top portion of the p-channel MOSFET device and coupled to the fixed positive output terminal, the p-channel MOSFET device having a drain, the p-channel MOSFET device having a gate pad coupled to the second polarity insensitive input terminal; and an n-channel MOSFET device including a source pad coupled to the fixed negative output terminal via a first interconnect, the n-channel MOSFET device having a drain, the n-channel MOSFET device having a gate pad coupled to the second polarity insensitive input terminal via a second interconnect, the n-channel MOSFET device being a vertically-oriented MOSFET device, the drain of the n-channel MOSFET device and the drain of the p-channel MOSFET device both being disposed on top of the first polarity insensitive input terminal; and a voltage limiter circuit disposed on top of the source pad of the n-channel MOSFET between the source pad and the gate pad of the n-channel MOSFET device, the voltage limiter circuit including a zener diode and a polysilicon resistor.

12. The apparatus of claim 11, wherein the lead frame, the p-channel MOSFET device, and the n-channel MOSFET device are packaged as a single, discrete component.

13. The apparatus of claim 11, wherein at least one of the p-channel MOSFET device or the n-channel MOSFET device have a gate dielectric rating greater than twenty-five volts, and a voltage rating of the gate pad of the n-channel MOSFET device is approximately equal to a drain-to-source voltage rating of the n-channel MOSFET device.

14. The apparatus of claim 11, wherein the drain of the n-channel MOSFET device is directly coupled to the first polarity insensitive input terminal without an intervening component.

15. The apparatus of claim 11, wherein the n-channel MOSFET device includes a gate dielectric having a thickness greater than 50 nanometers.

16. An apparatus, comprising:
a four-terminal lead frame including a pair of polarity insensitive input terminals and a pair of output terminals;

a first p-channel MOSFET device and a first n-channel MOSFET device disposed on a first polarity insensitive input terminal from the pair of polarity insensitive input terminals, the first p-channel MOSFET device being operably coupled to a first output terminal from the pair of output terminals of the four terminal lead frame via a first wire interconnect; and a second p-channel MOSFET device and a second n-channel MOSFET device disposed on a second polarity insensitive input terminal from the pair of polarity insensitive input terminals, the second p-channel MOSFET device being operably coupled to the first output terminal from the pair of output terminals of the four terminal lead frame via a second wire interconnect, a voltage limiter circuit disposed on top of a source pad of the first n-channel MOSFET between the source pad and a gate pad of the first n-channel MOSFET device, the voltage limiter circuit including a zener diode and a polysilicon resistor.

17. The apparatus of claim 16, wherein the first p-channel MOSFET device is a vertically-oriented MOSFET device having a drain coupled on the first polarity insensitive input terminal, and the first n-channel MOSFET device is a vertically-oriented MOSFET device having a drain coupled to the first polarity insensitive input terminal.

18. The apparatus of claim 16, further comprising:
a third wire interconnect operably coupling a gate of the first n-channel MOSFET device and the voltage limiter circuit to the second polarity insensitive input terminal of the four-terminal lead frame.

19. The apparatus of claim 16, wherein at least one of the first p-channel MOSFET device or the first n-channel MOSFET device has a gate dielectric rating greater than twenty-five volts.

20. The apparatus of claim 16, wherein the voltage limiter circuit is configured to limit current, the zener diode is configured to function as a clamping diode.

* * * * *

UNITED STATES PATENT AND TRADEMARK OFFICE
CERTIFICATE OF CORRECTION

PATENT NO. : 8,531,226 B2
APPLICATION NO. : 13/270726
DATED : September 10, 2013
INVENTOR(S) : Montalbo et al.

Page 1 of 1

It is certified that error appears in the above-identified patent and that said Letters Patent is hereby corrected as shown below:

In the Claims

Column 16, line 15, claim 1, delete "bad" and insert -- pad --, therefor.

Column 16, line 34, claim 3, delete "bad" and insert -- pad --, therefor.

Signed and Sealed this
Nineteenth Day of November, 2013

Teresa Stanek Rea
*Deputy Director of the United States Patent and Trademark Office*